United States Patent [19]

Nishizawa et al.

[11] Patent Number: 5,254,207
[45] Date of Patent: Oct. 19, 1993

[54] METHOD OF EPITAXIALLY GROWING SEMICONDUCTOR CRYSTAL USING LIGHT AS A DETECTOR

[75] Inventors: Jun-ichi Nishizawa, 6-16, Komegafukuro 1-chome, Aoba-ku, Sendai-shi, Miyagi-ken; Toru Kurabayashi, Sendai, both of Japan

[73] Assignees: Research Development Corporation of Japan, Tokyo; Jun-ichi Nishizawa, Sendai; Zaidan Hojin; Handotai Kenkyu Shinkoka, all of Japan

[21] Appl. No.: 983,331

[22] Filed: Nov. 30, 1992

[30] Foreign Application Priority Data

Nov. 30, 1991 [JP] Japan ............... 3-342448

[51] Int. Cl.⁵ ............................................. C30B 23/02
[52] U.S. Cl. .................................... 156/601; 156/612; 356/382; 356/318
[58] Field of Search ............... 156/612, 601; 356/317, 356/318, 319, 330, 346, 382

[56] References Cited

U.S. PATENT DOCUMENTS

| | | | |
|---|---|---|---|
| 4,068,125 | 1/1978 | Bell | 356/318 |
| 4,999,508 | 3/1991 | Hyakumura | 356/382 |
| 5,047,639 | 9/1991 | Wong | 356/318 |
| 5,096,533 | 3/1992 | Igayashi | 156/612 |
| 5,171,399 | 12/1992 | Brennan et al. | 156/601 |

Primary Examiner—Olik Chaudhuri
Assistant Examiner—Ramamohan Rao Paladugu
Attorney, Agent, or Firm—Fish & Richardson

[57] ABSTRACT

Material and impurity gases are introduced into a crystal growth chamber to grow a crystal film on a GaAs substrate. A light beam emitted from a variable-wavelength light source is applied to the crystal film being grown on the substrate while varying the wavelength of the light beam. The dependency, on the wavelength of the light beam, of the intensity of light reflected by the crystal film is measured, and an optimum wavelength is selected for measurement depending on the type of molecules adsorbed while the crystal film is being grown. Light is then applied at the optimum wavelength to the crystal film being grown, and a time-dependent change in the intensity of light reflected by the crystal film is measured. The rate at which the material gases are introduced into the crystal growth chamber is adjusted to control the growth rate of the crystal film, the composition ratio of a mixed crystal thereof, and the density of the impurity therein.

4 Claims, 4 Drawing Sheets

METHOD OF EPITAXIALLY GROWING SEMICONDUCTOR CRYSTAL USING LIGHT AS A DETECTOR

BACKGROUND OF THE INVENTION

1. Field of the Invention

The present invention relates to a method of epitaxially growing a semiconductor crystal by introducing a material or a material gas into a crystal growth apparatus, and more particularly to a method of epitaxially growing a semiconductor crystal while controlling the growth rate of a crystal film being grown, the composition ratio of a mixed crystal, and the density of an impurity during epitaxial growth of the semiconductor crystal.

2. Description of the Prior Art

It is very important to control the growth rate of a crystal film that is being grown in the epitaxial growth of a semiconductor crystal.

Heretofore, it has been customary in molecular beam epitaxy and migration enhanced epitaxy to measure the thickness of a crystal film being grown using vibrations of reflection high-energy electronic diffraction (RHEED) and adjust the rate at which the material evaporates based on the measured thickness for thereby controlling the growth rate of the crystal film in terms of molecular layers.

The above growth rate control process is reported in an article written by T. Sakamoto. et al., Jpn. J Appl. Phys. Vol. 23, No. 9, PPL657~L659 (1984).

Actually, in the reported growth rate control process, a crystalline substrate is rotated while a crystal film is being grown on the crystalline substrate in order to uniformly planarize the crystal film.

When a crystal film is grown on a crystalline substrate while the crystalline substrate is being rotated, however, since the direction of the crystal axis and the direction of a high-energy electron beam are varied by the rotation of the crystalline substrate, it is practically impossible to control the growth rate of the crystal film accurately based on the measured data produced by the RHEED process.

At present, therefore, the growth rate of a crystal film being grown is controlled under the conditions which are the same as growth conditions that are obtained when the crystalline substrate is not rotated. Such a growth rate control procedure is complex and time-consuming as it requires adjustment of the evaporation rate of a material within a crystal growth apparatus using a crucible that are controlled in temperature highly accurately.

Application of a high-energy electron beam to the surface of a crystal film being grown tends to cause imperfections in the crystal.

Another problem of the conventional growth rate control practice is that because of the electron beam used, an ultra-high vacuum must be developed in the crystal growth apparatus.

Furthermore, the RHEED process is designed to measure the thickness of a crystal film that is formed of only one material. When a crystal film is grown from a plurality of materials, it is impossible to measure and control the composition ratio of and the density of impurities in the mixed crystal that is grown.

SUMMARY OF THE INVENTION

It is an object of the present invention to provide a method of epitaxially growing a semiconductor crystal on a crystalline substrate, which method is capable of growing the semiconductor crystal while rotating the crystalline substrate to uniformly planarize a crystal film for easily controlling the growth rate of the crystal film without adversely affecting the crystal when it is grown, can be carried out not only in an ultra-high vacuum but also under atmospheric pressure, and is also capable of measuring and controlling the composition ratio of and the density of impurities in a mixed crystal that is grown from a plurality of materials.

According to the present invention, there is provided a method of epitaxially growing a semiconductor crystal, comprising introducing a material or a material gas and an impurity or an impurity gas into a crystal growth chamber to grow a crystal film on a substrate therein, applying a light beam from a variable-wavelength light source to the crystal film being grown on the substrate while varying the wavelength of the light beam, measuring the dependency, on the wavelength of the light beam, of the intensity of light reflected or diffused by the crystal film, selecting an optimum wavelength for measurement depending on the type of molecules adsorbed while the crystal film is being grown, applying light at the optimum wavelength to the crystal film being grown, measuring a time-dependent change in the intensity of light reflected or diffused by the crystal film, and adjusting the rate at which the material or the material gas is introduced into the crystal growth chamber to control the growth rate of the crystal film, the composition ratio of a mixed crystal thereof, and the density of the impurity therein.

The variable-wavelength light source may comprise a source of white light and a spectroscope for producing light at a selected wavelength from the white light. Alternatively, the variable-wavelength light source may be a variable-wavelength laser beam source.

The crystal growth apparatus may comprise a molecular layer epitaxy apparatus, a molecular beam epitaxy apparatus, a metal organic chemical vapor deposition apparatus, a chloride gas phase growth apparatus, or a hydride gas phase growth apparatus. The crystal growth apparatus has the variable-wavelength light source and detecting means for detecting the dependency, on the wavelength of the light beam, of the intensity of light reflected or diffused by the crystal film and the time-dependent change in the intensity of light reflected or diffused by the crystal film.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

The principles of the present invention will be described below as being applied to the epitaxial growth of a GaAs film.

Figure 1:
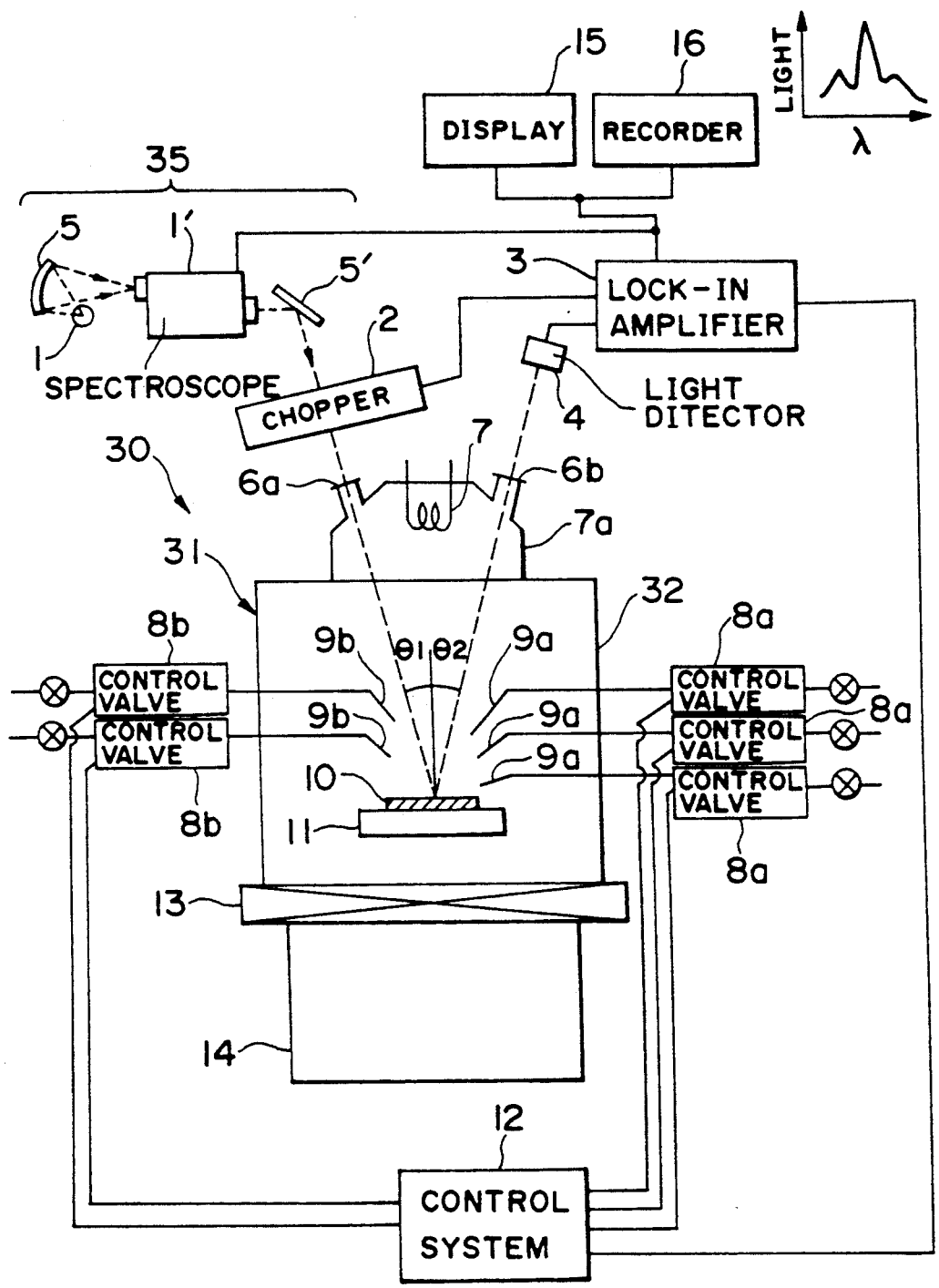
FIG. 1 is a schematic view, partly in block form, of a molecular layer epitaxy apparatus for growing a GaAs crystal film, the apparatus being used to carry out a method of epitaxially growing a semiconductor crystal according to the present invention.

FIG. 1 shows a molecular layer epitaxy apparatus for growing a GaAs film, the apparatus being used to carry out a method of epitaxially growing a semiconductor crystal according to the present invention. The molecular layer epitaxy apparatus shown in FIG. 1 is reported in an article written by J. Nishizawa, H. Abe, and T. Kurabayashi, J. Electrochem Soc. 132 (1985), pp 1197~1200.

The molecular layer epitaxy apparatus shown in FIG. 1, which is generally designated by the reference numeral 30, includes a sealed container 31 having a gate valve 13 and a evacuating device 14 such as a turbo molecular pump or the like which is positioned below the gate valve 13. The sealed container 31 also has a crystal growth chamber 32 disposed above the gate valve 13. The crystal growth chamber 32 houses a susceptor 11 which supports a substrate 10 of monocrystalline GaAs thereon.

The crystal growth chamber 32 also accommodates a plurality of material gas inlet nozzles 9a disposed above and directed toward the substrate 10 and a plurality of impurity gas inlet nozzles 9b also disposed above and directed toward the substrate 10. The material gas inlet nozzles 9a and the impurity gas inlet nozzles 9b are positioned in confronting relationship to each other. The material gas inlet nozzles 9a are coupled to respective control valves 8a that are electrically connected to a control system 12. The impurity gas inlet nozzles 9b are coupled to respective control valves 8b that are also electrically connected to the control system 12.

A lamp 7 for heating the substrate 10 is disposed in a casing 7a supported on the top of the crystal growth chamber 32. The casing 7a has a pair of light inlet and outlet windows 6a, 6b disposed one on each side of the lamp 7 for passing a beam of light therethrough. The light inlet and outlet windows 6a, 6b are oriented such that the beam of light passing therethrough is applied to and reflected from the substrate 10 at respective angles $\theta 1$, $\theta 2$ with respect to the vertical direction.

When the substrate 10 grows on the susceptor 11, a light beam having a desired wavelength is applied from a variable-wavelength light source 35 to the substrate 10 at the angle $\theta 1$. The variable-wavelength light source 35 comprises a source 1 of white light, a mirror 5, a spectroscope 1', and a mirror 5'. The light emitted from the source 1 is reflected by the mirror 5 to the spectroscope 1', which produces a desired component wavelength. The light produced by the spectroscope 1' is reflected by the mirror 5' toward the light inlet window 6a. The variable-wavelength light source 35 is positioned above the light inlet window 6a, and a chopper 2 is interposed between the variable-wavelength light source 35 and the light inlet window 6a for chopping the light emitted from the variable-wavelength light source 35.

Alternatively, the variable-wavelength light source 35 may be a variable-wavelength laser beam source.

A light detector 4 such as an Si photodiode or the like is positioned above the light outlet window 6b for detecting the light beam reflected from the substrate 10 and passing through the light outlet window 6b.

The chopper 2 and the light detector 4 are electrically connected to a lock-in amplifier 3 which in turn is electrically connected to the control system 12. A display unit 15 and a recorder 16 are electrically connected to the lock-in amplifier 3.

Operation of the molecular layer epitaxy apparatus 30 shown in FIG. 1 operates as follows:

First, the control system 12 controls the control valves 8a, 8b to supply a material gas containing Ga, a material gas containing As, and an impurity gas through the material gas inlet nozzles 9a and the impurity gas inlet nozzles 9b into the crystal growth chamber 31. The material gases are alternately supplied into the crystal growth chamber 31. In the crystal growth chamber 31, the material and impurity gases are applied to the substrate 10 that is controlled in temperature by the lamp 7, for thereby epitaxially growing a GaAs crystal film on the substrate 10.

The intensity of a light beam reflected from the GaAs crystal film as it grows on the substrate 10 is measured to determine its dependency on the wavelength of the light beam. More specifically, while the wavelength of the light emitted from the wavelength-variable light source 35 is being varied by the spectroscope 1', the light beam reflected by the mirror 5' is chopped by the chopper 2. The chopped light beam is applied through the light inlet window 6a to the GaAs crystal film being grown, and is reflected from the GaAs crystal film through the outlet window 6b to the light detector 4, which detects the intensity of the reflected light beam.

The light detector 4 applies an output signal, indicative of the detected intensity, to the lock-in amplifier 3 that applies a processed signal to the control system 12, the display unit 15, the recorder 16. At this time, the spectroscope 1' supplies a wavelength signal to the display unit 15 and the recorder 16 to enable them to display and record intensity vs. wavelength characteristics.

The operator then observes displayed and recorded intensity vs. wavelength characteristics, and selects an optimum wavelength (which is a maximum-amplitude wavelength in most cases) for the measurement of the growth of monocrystalline GaAs. Thereafter, light is applied at the selected wavelength to the GaAs crystal film being grown on the substrate 10, and a time-dependent change in the intensity of the light reflected from the GaAs crystal film is measured.

Figure 2:
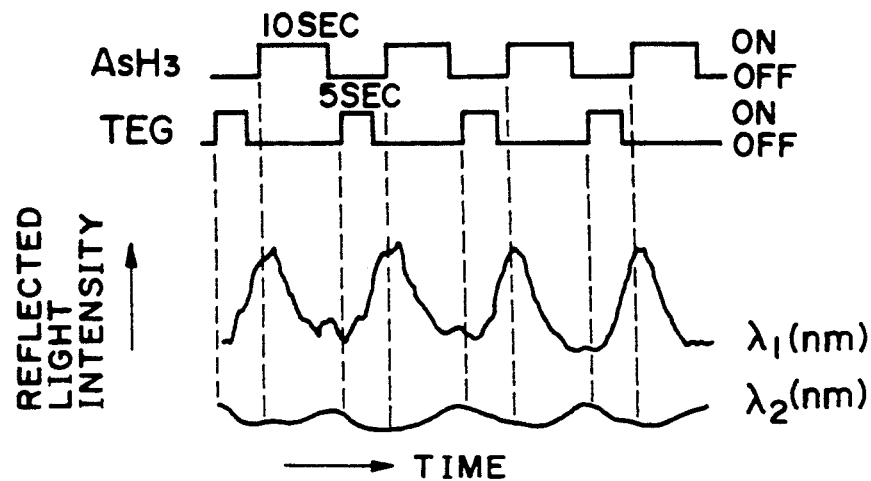
FIG. 2 is a diagram showing the manner in which the intensity of light reflected from the GaAs crystal film varies when the GaAs crystal film is grown in the molecular layer epitaxy apparatus shown in FIG. 1.

FIG. 2 shows the manner in which the intensity of light reflected from the GaAs crystal film varies and the sequence in which the material gases are introduced when the GaAs crystal film is epitaxially grown by the molecular beam epitaxy apparatus 30.

As seen from FIG. 2, when the light beam applied to the GaAs crystal film has a wavelength $\lambda_1$ (nm), the intensity of the reflected light increases with time upon introduction of triethyl gallium (TEG) as the material gas containing gallium (Ga), and decreases with time upon introduction of arsine (AsH₃) as the material gas containing arsenic (As). Conversely, when the light beam applied to the GaAs crystal film has a wavelength $\lambda_2$ (nm), the intensity of the reflected light decreases with time upon introduction of triethyl gallium, and increases with time upon introduction of arsine.

Figure 3:
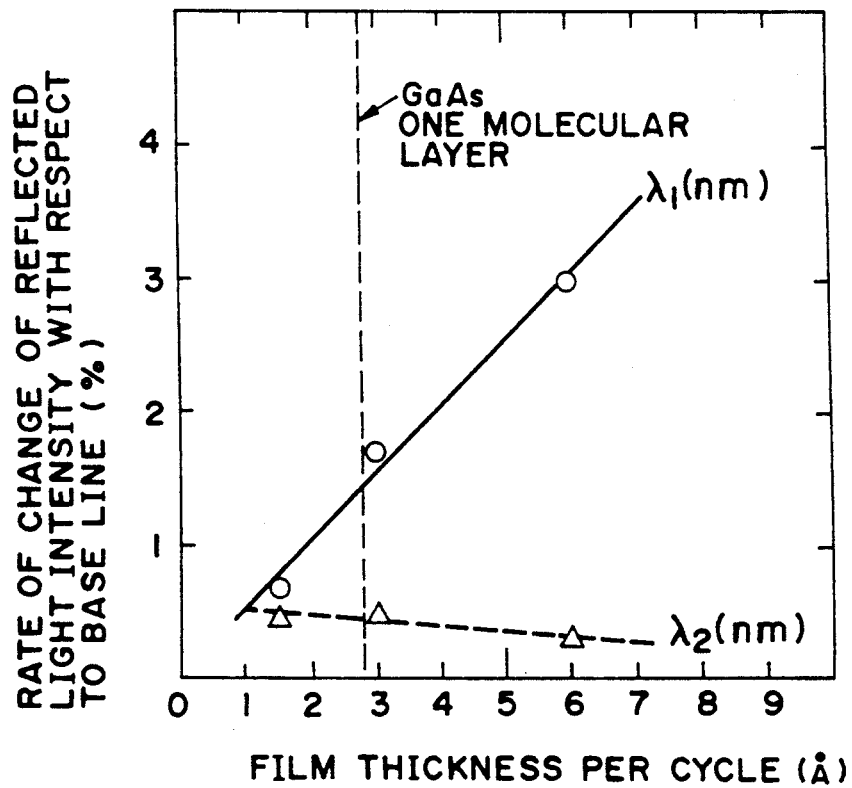
FIG. 3 is a graph showing the correlation between the rate of change of a reflected light intensity and a film thickness per cycle in the molecular layer epitaxy apparatus shown in FIG. 1.

FIG. 3 illustrates the correlation between the rate of change of the intensity of the reflected light with respect to an intensity base line (which indicates the reflected light intensity when no crystal growth occurs) and a film thickness per cycle for the wavelengths $\lambda_1$, $\lambda_2$ when the GaAs crystal film is epitaxially grown by the molecular layer epitaxy apparatus 30.

The information about the amount of the impurity being doped and the composition of the mixed crystal can be obtained using the wavelength-dependency of the reflected light intensity depending on the introduced material gas, i.e., the type of adsorbed molecules, and the correlation between the rate of change of the reflected light intensity and the film thickness per cycle. Therefore, the amount of the impurity being doped and the composition of the mixed crystal can be controlled.

The wavelength of the light emitted from the variable-wavelength light source 35 is fixed to the optimum wavelength, i.e., the maximum-amplitude wavelength $\lambda_1$. Then, as shown in FIG. 1, the output signal from the lock-in amplifier 3 is supplied to the control system 12, which stores in advance a change in the reflected light intensity at the wavelength $\lambda_1$, corresponding to the film thickness per cycle. When a change in the output signal from the lock-in amplifier 3 reaches the stored change in the reflected light intensity, the introduction of the material gases is stopped. In this manner, the growth rate of the GaAs crystal film being grown on the substrate 10 can be controlled with accuracy in terms of molecular layers to obtain a desired film thickness.

In the event that a nucleus is formed on the surface of the crystal film being grown, it diffuses the applied light, resulting in a reduction in the reflected light intensity. To avoid such a drawback, the material gases are controlled by the control system 12 to minimize such a reduction in the reflected light intensity for thereby developing a step-flow growth condition. As a result, the surface of the GaAs crystal film can be made flat in atomic levels.

The light emitted from the variable-wavelength light source 35 may be infrared radiation, visible light, or ultraviolet radiation. Since the intensity of the reflection of such light is measured, the GaAs crystal being grown is not adversely affected thereby.

Because infrared radiation, visible light, or ultraviolet radiation is used, it is not necessary to develop an ultrahigh vacuum in the crystal growth apparatus as is the case with the conventional apparatus which employs the RHEED. As the light applied to the GaAs crystal film is emitted from the light source external to the crystal growth chamber, the pressure in the crystal growth chamber may be atmospheric pressure or higher. Therefore, the method according to the present invention is applicable to crystal growth in a wide range of pressures in the crystal growth chamber.

The reflected light intensity varies irrespective of the crystal axis except for certain special cases. Therefore, the crystal film may be grown on the substrate 10 while the substrate 10 is being rotated for uniformly planarizing the crystal film. As a consequence, the growth rate of the crystal film being grown on the substrate 10 can be controlled with accuracy in terms of molecular layers.

The molecular layer epitaxy apparatus 30 may be used as an epitaxy apparatus for epitaxially growing an Si layer. In such an epitaxy apparatus, a crystal of monocrystalline Si is used in place of the monocrystalline substrate 10 of GaAs, and the crystal growth chamber 32 is supplied with a material gas containing Si and hydrogen instead of the material gas containing Ga and the material gas containing As.

Figure 4:
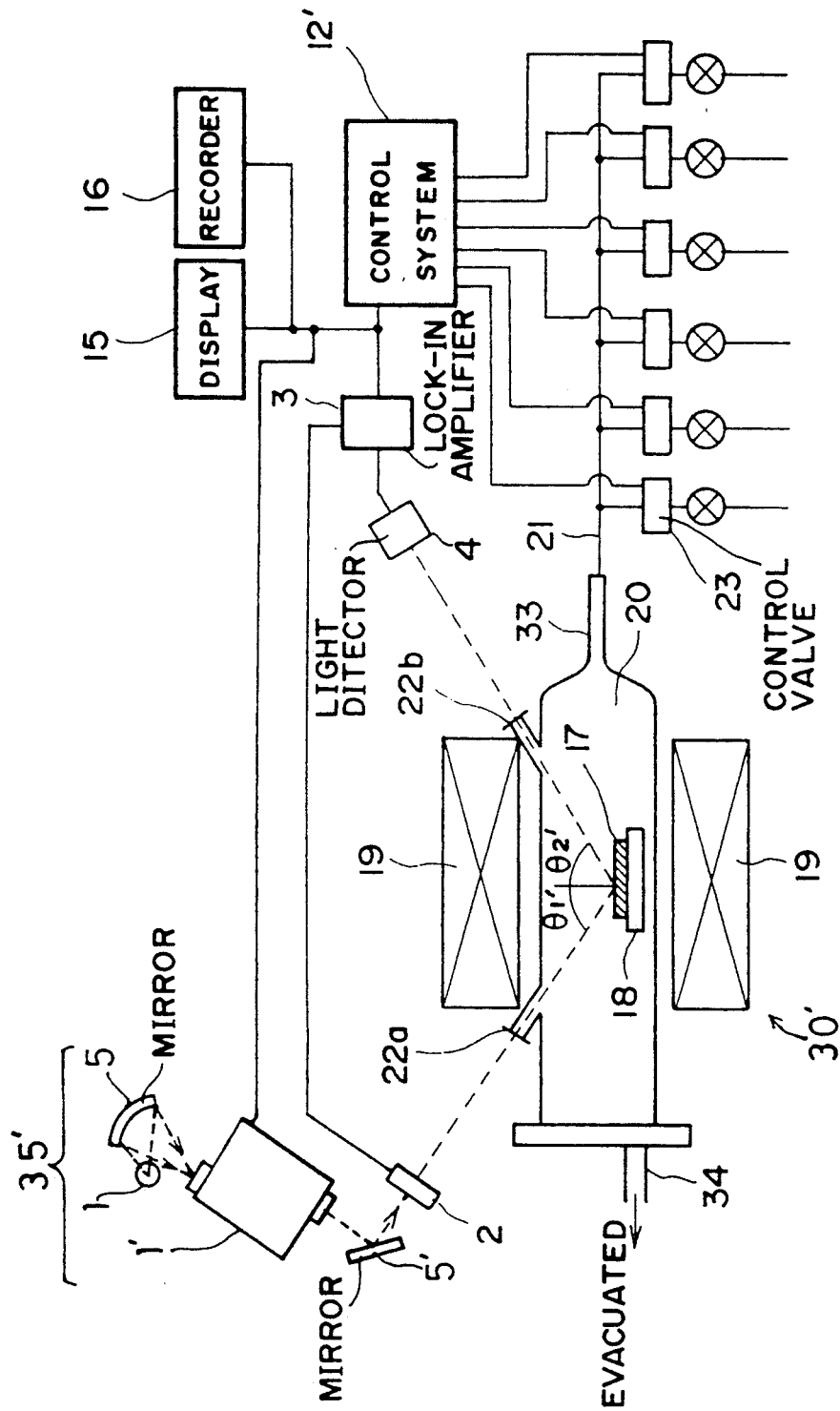
FIG. 4 is a schematic view, partly in block form, of a metal organic chemical vapor deposition apparatus which is used to carry out the method according to the present invention.

FIG. 4 shows a metal organic chemical vapor deposition (MO-CVD) apparatus 30', which is one of GaAs vapor phase growth apparatus, for growing a GaAs film, the apparatus being used to carry out the method according to the present invention.

As shown in FIG. 4, the MO-CVD apparatus 30' has a cylindrical reaction tube 20 of quartz having a gas inlet port 33 on one end and a gas outlet port 34 on the opposite end. The gas inlet port 33 is connected to a gas supply nozzle 21 for supplying a material gas and a gas containing a dopant, the gas supply nozzle 21 being connected to a plurality of control valves 23. The control valves 23 are electrically connected to a control system 12'.

The reaction tube 20 houses a susceptor 18 of quartz and a substrate 17 of monocrystalline GaAs. The reaction tube 20 is surrounded by a heater 19.

The reaction tube 20 has a pair of light inlet and outlet windows 22a, 22b disposed one on each side of the heater 19 for passing a beam of light therethrough. The light inlet and outlet windows 22a, 22b are oriented such that the beam of light passing therethrough is applied to and reflected from the substrate 17 at respective angles $\theta 1'$, $\theta 2'$ with respect to the vertical direction.

A variable-wavelength light source 35', which is identical to the variable-wavelength light source 35 shown in FIG. 1, applies a light beam at a desired wavelength through the light inlet window 22a to the substrate 17.

The variable-wavelength light source 35' is positioned above the light inlet window 22a, and a chopper 2 is interposed between the variable-wavelength light source 35' and the light inlet window 22a for chopping the light emitted from the variable-wavelength light source 35'.

A light detector 4 such as an Si photodiode or the like is positioned above the light outlet window 22b for detecting the light beam reflected from the substrate 17 and passing through the light outlet window 22b.

The chopper 2 and the light detector 4 are electrically connected to a lock-in amplifier 3 which in turn is electrically connected to the control system 12'. A display unit 15 and a recorder 16 are electrically connected to the lock-in amplifier 3.

A semiconductor crystal is epitaxially grown on the substrate 17 in the MO-CVD apparatus 30' as follows:

A material gas containing Ga, and a material gas containing As are alternately supplied by the control system 12' into the reaction tube 20 to epitaxially grow a GaAs crystal film on the substrate 17 while the control system 12' is controlling the time in which the material gases are introduced and the time in which the reaction tube 20 is evacuated.

Then, the dependency of the intensity of a light beam reflected from the GaAs crystal film as it grows on the substrate 17 on the wavelength of the light beam is measured. More specifically, while the wavelength of the light emitted from the wavelength-variable light source 35' is being varied by the spectroscope 1', the light beam reflected by the mirror 5' is chopped by the chopper 2 and applied through the light inlet window 22a to the GaAs crystal film being grown, and is reflected from the GaAs crystal film through the outlet window 22b to the light detector 4, which detects the intensity of the reflected light beam.

The light detector 4 applies an output signal, indicative of the detected intensity, to the lock-in amplifier 3 that applies a processed signal to the display unit 15 and the recorder 16 At this time, the spectroscope 1' supplies a wavelength signal to the display unit 15 and the recorder 16 to enable them to display and record intensity vs. wavelength characteristics.

The operator then observes displayed and recorded intensity vs. wavelength characteristics, and selects an optimum wavelength for the measurement of the growth of monocrystalline GaAs. Thereafter, light is applied at the selected wavelength to the GaAs crystal film being grown on the substrate 17, and a time-dependent change in the intensity of the light reflected from the GaAs crystal film is measured.

Using the wavelength-dependency of the reflected light intensity depending on the introduced material gas, i.e., the type of adsorbed molecules, and the correlation between the rate of change of the reflected light intensity and the film thickness per cycle, the information about the amount of the impurity being doped and the composition of the mixed crystal is obtained. The amount of the impurity being doped and the composition of the mixed crystal are controlled while the GaAs crystal film is being grown.

The change in the reflected light intensity at the optimum wavelength is also supplied from the lock-in amplifier 3 to the control system 12'. When a change in the output signal from the lock-in amplifier 3 reaches the change in the reflected light intensity which corresponds to the film thickness per cycle, the control system 12' closes the control valves 23 to stop the introduction of the material and dopant gases. In this manner, the growth rate of the GaAs crystal film being grown on the substrate 17 can be controlled to obtain a desired film thickness.

The method according to the present invention is also applicable to a vapor phase growth process using $GaCl_3$ and $AsH_3$, a chloride vapor phase growth process using $Ga-AsCl_3-H_2$, and a hydride vapor phase growth process using $Ga-AsH_3-HCl$.

Figure 5:
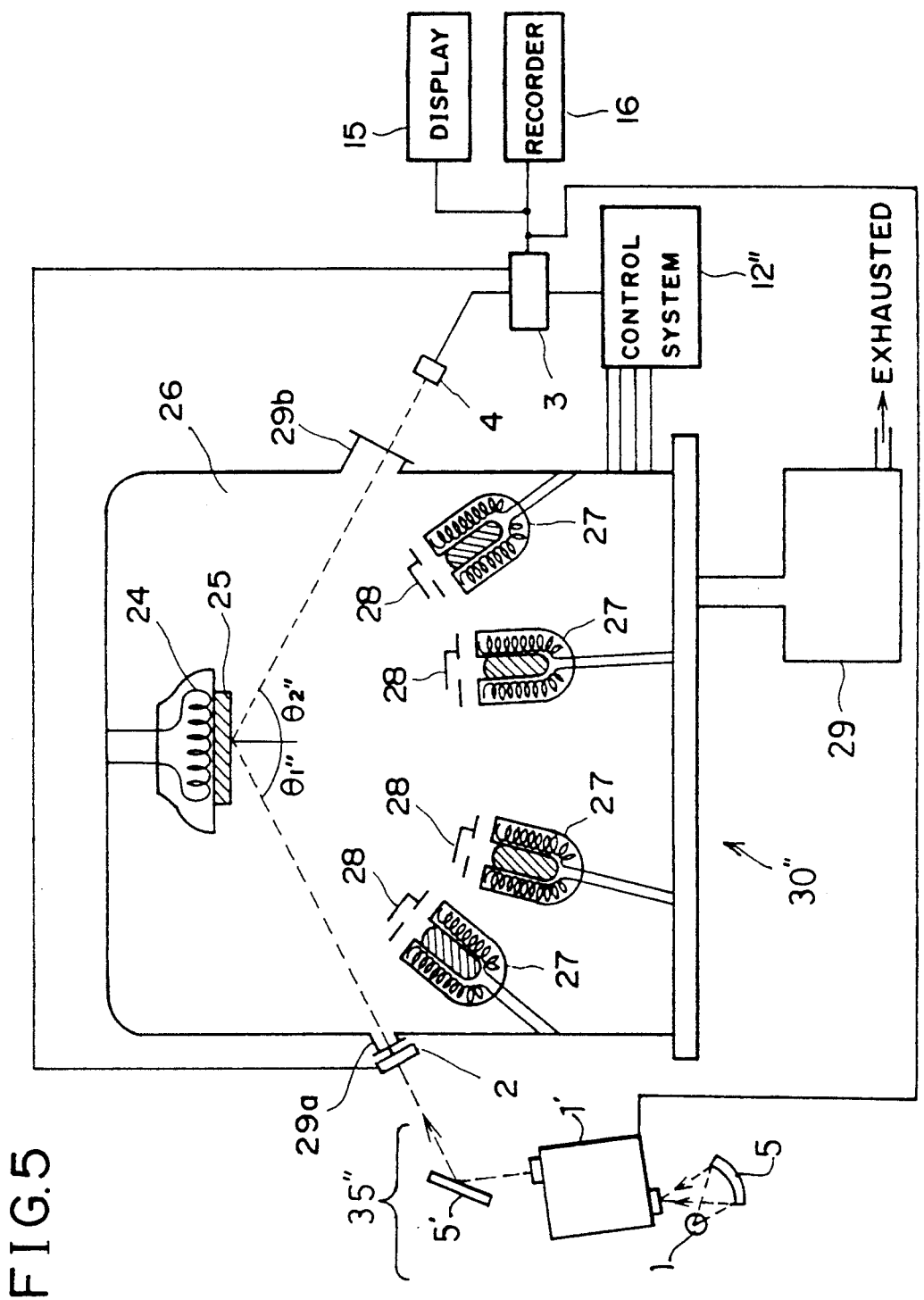
FIG. 5 is a schematic view, partly in block form, of a molecular beam epitaxy apparatus which is used to carry out the method according to the present invention.

FIG. 5 shows a molecular beam epitaxy apparatus 30", which is one of GaAs vapor phase growth apparatus, for growing a GaAs film, the apparatus being used to carry out the method according to the present invention.

As shown in FIG. 5, the molecular beam epitaxy apparatus 30" has a sealed container which defines a crystal growth chamber 26 which creates an ultra-high vacuum therein. A evacuating device 14 such as an ion pump, a turbo molecular pump or the like is connected to the bottom of the crystal growth chamber 26.

A heater 24 for heating a substrate is disposed in the crystal growth chamber 26 and supported on the top thereof. A substrate 25 of monocrystalline GaAs is positioned closely beneath the heater 24. A plurality of crucibles 27 for heating materials containing Ga, As are disposed in the crystal growth chamber 26 and supported on the bottom thereof. Each of the crucibles 27 has an opening associated with a shutter 28 for controlling a molecular beam.

The crystal growth chamber 26 has, on its confronting side walls, a pair of light inlet and outlet windows 29a, 29b disposed for passing a beam of light therethrough. The light inlet and outlet windows 29a, 29b are oriented such that the beam of light passing therethrough is applied to and reflected from the substrate at respective angles $\theta 1''$, $\theta 2''$ with respect to the vertical direction.

A variable-wavelength light source 35", which is identical to the variable-wavelength light source 35 shown in FIG. 1, applies a light beam at a desired wavelength through the light inlet window 29a to the substrate 25.

The variable-wavelength light source 35" is positioned laterally outwardly of the light inlet window 29a, and a chopper 2 is interposed between the variable-wavelength light source 35" and the light inlet window 29a for chopping the light emitted from the variable-wavelength light source 35".

A light detector 4 such as an Si photodiode or the like is positioned laterally outwardly of the light outlet window 29b for detecting the light beam reflected from the substrate 25 and passing through the light outlet window 29b.

The chopper 2 and the light detector 4 are electrically connected to a lock-in amplifier 3 which in turn is electrically connected to the control system 12". A display unit 15 and a recorder 16 are electrically connected to the lock-in amplifier 3.

The control system 12" is also electrically connected to an electric system of the crystal growth chamber 26, and the electric system is electrically connected to the shutters 28 and other accessory devices.

A semiconductor crystal is epitaxially grown on the substrate 25 in the molecular beam epitaxy apparatus 30" as follows:

The control system 12" controls the shutters 28 to supply molecular beams of Ga, As alternately to the substrate 25 for thereby growing a GaAs crystal layer on the substrate 25.

Then, the dependency of the intensity of a light beam reflected from the GaAs crystal film as it grows on the substrate 25 on the wavelength of the light beam is measured. More specifically, while the wavelength of the light emitted from the wavelength-variable light source 35" is being varied by the spectroscope 1', the light beam reflected by the mirror 5' is chopped by the chopper 2 and applied through the light inlet window 29a to the GaAs crystal film being grown, and is reflected from the GaAs crystal film through the outlet window 22b to the light detector 4, which detects the intensity of the reflected light beam.

The light detector 4 applies an output signal, indicative of the detected intensity, to the lock-in amplifier 3 that applies a processed signal to the display unit 15 and the recorder 16. At this time, the spectroscope 1' supplies a wavelength signal to the display unit 15 and the recorder 16 to enable them to display and record intensity vs. wavelength characteristics.

The operator then observes displayed and recorded intensity vs. wavelength characteristics, and selects an optimum wavelength for the measurement of the growth of monocrystalline GaAs. Thereafter, light is applied at the selected wavelength to the GaAs crystal film being grown on the substrate 25, and a time-dependent change in the intensity of the light reflected from the GaAs crystal film is measured.

Using the wavelength-dependency of the reflected light intensity depending on the introduced material gas, i.e., the type of adsorbed molecules, and the correlation between the rate of change of the reflected light intensity and the film thickness per cycle, the information about the amount of the impurity being doped and the composition of the mixed crystal is obtained. The amount of the impurity being doped and the composition of the mixed crystal are controlled while the GaAs crystal film is being growth.

The change in the reflected light intensity at the optimum wavelength is also supplied from the lock-in amplifier 3 to the control system 12". When a change in the output signal from the lock-in amplifier 3 reaches the change in the reflected light intensity which corresponds to the film thickness per cycle, the control system 12' closes the shutters 28 to stop the application of the molecular beams. In this manner, the growth rate of the GaAs crystal film being grown on the substrate 25 can be controlled to obtain a desired film thickness with the accuracy in terms of molecular layers.

The conventional RHEED process which utilizes electron beam diffraction is required to align the crystal axis and the high-energy electron beam, and unable to grow a crystal on a substrate while the substrate is being rotated. The reflected light intensity varies irrespective of the crystal axis. Therefore, the crystal film may be grown on the substrate 25 while the substrate 25 is being rotated for uniformly planarizing the crystal film.

The principles of the present invention are also applicable to other epitaxy processes such as MLE and VPE. The parameters in the growth process may also be monitored when changes in the intensity of diffused light, rather than reflected light, are measured.

Although a certain preferred embodiment of the present invention has been shown and described in detail, it should be understood that various changes and modifications may be made therein without departing from the scope of the appended claims.

What is claimed is:

1. A method of epitaxially growing a semiconductor crystal, comprising:

introducing a material or a material gas and an impurity or an impurity gas into a crystal growth chamber to grow a crystal film on a substrate therein;

applying a light beam from a variable-wavelength light source to the crystal film being grown on the substrate while varying the wavelength of the light beam;

measuring the dependency, on the wavelength of the light beam, of the intensity of light reflected or diffused by the crystal film;

selecting an optimum wavelength for measurement dependent on the type of molecules adsorbed while the crystal film is being grown;

applying light at said optimum wavelength to the crystal film being grown;

measuring a time - dependent change in the intensity of light reflected or diffused by the crystal film; and based on the time dependent change in the intensity of light measured adjusting the rate at which the material or the material gas is introduced into the crystal growth chamber to control the growth rate of the crystal film, the composition ratio of a mixed crystal thereof, and the density of the impurity therein.

2. A method according to claim 1, wherein said variable-wavelength light source comprises a source of white light and a spectroscope for producing light at a selected wavelength from the white light.

3. A method according to claim 1, wherein said variable-wavelength light source comprises a variable-wavelength laser beam source.

4. A method according to any one of claims 1 through 3, wherein said crystal growth apparatus comprises one of a molecular layer epitaxy apparatus, a molecular beam epitaxy apparatus, a metal organic chemical vapor deposition apparatus, a chloride gas phase growth apparatus, and a hydride gas phase growth apparatus, said crystal growth apparatus having said variable-wavelength light source and detecting means for detecting the dependency, on the wavelength of the light beam, of the intensity of light reflected or diffused by the crystal film and the time-dependent change in the intensity of light reflected or diffused by the crystal film.

* * * * *